United States Patent
Asano

(10) Patent No.: US 10,020,441 B2
(45) Date of Patent: Jul. 10, 2018

(54) PIEZOELECTRIC TRANSFORMER DEVICE

(71) Applicant: Murata Manufacturing Co., Ltd., Nagaokakyo-shi, Kyoto-fu (JP)

(72) Inventor: Hiroshi Asano, Nagaokakyo (JP)

(73) Assignee: MURATA MANUFACTURING CO., LTD., Nagaokakyo-Shi, Kyoto-Fu (JP)

(*) Notice: Subject to any disclaimer, the term of this patent is extended or adjusted under 35 U.S.C. 154(b) by 330 days.

(21) Appl. No.: 14/740,394

(22) Filed: Jun. 16, 2015

(65) Prior Publication Data

US 2015/0280104 A1  Oct. 1, 2015

Related U.S. Application Data

(63) Continuation of application No. PCT/JP2013/073034, filed on Aug. 28, 2013.

(30) Foreign Application Priority Data

Dec. 19, 2012  (JP) .................................. 2012-277177

(51) Int. Cl.
*H01L 41/107* (2006.01)
*H01L 41/047* (2006.01)

(52) U.S. Cl.
CPC ........ *H01L 41/107* (2013.01); *H01L 41/0475* (2013.01)

(58) Field of Classification Search
CPC . H01L 41/107; H01L 41/0475; H01L 41/044; A61B 2017/0011; B06B 3/00; B08B 3/12

(Continued)

(56) References Cited

U.S. PATENT DOCUMENTS

| | | | | |
|---|---|---|---|---|
| 5,949,179 A | * | 9/1999 | Kumasaka | H01L 41/053 310/348 |
| 7,288,069 B2 | * | 10/2007 | Takeuchi | B06B 1/0622 310/335 |

(Continued)

FOREIGN PATENT DOCUMENTS

| | | |
|---|---|---|
| JP | H11-121826 A | 4/1990 |
| JP | H03-4576 A | 1/1991 |

(Continued)

OTHER PUBLICATIONS

Japanese Office Action dated Dec. 22, 2015, issued for counterpart application JP 2014-250552 (with English translation).

(Continued)

*Primary Examiner* — Bryan Gordon
(74) *Attorney, Agent, or Firm* — Arent Fox LLP

(57) ABSTRACT

A piezoelectric transformer device is disclosed having a decreased thickness. In particular, a piezoelectric transformer device is disclosed that includes a piezoelectric transformer element in which first and second element electrodes are provided on first and second side surfaces of a piezoelectric transformer main body, respectively, and first and second flexible electrode members which are arranged at the lateral sides of the first and second side surfaces of the piezoelectric transformer main body, respectively, and are electrically and mechanically connected to the first and second element electrodes, respectively.

18 Claims, 4 Drawing Sheets

(58) Field of Classification Search
USPC .................................. 310/359, 318, 319, 334
See application file for complete search history.

(56) References Cited

U.S. PATENT DOCUMENTS

| | | | | |
|---|---|---|---|---|
| 2007/0145860 | A1* | 6/2007 | Aoki | A61B 8/4281 |
| | | | | 310/334 |
| 2009/0034370 | A1* | 2/2009 | Guo | B06B 1/0622 |
| | | | | 367/180 |
| 2011/0198968 | A1* | 8/2011 | Sato | A61B 8/4483 |
| | | | | 310/317 |
| 2012/0022378 | A1* | 1/2012 | Ishidai | B06B 1/0622 |
| | | | | 600/459 |
| 2014/0132114 | A1* | 5/2014 | Fukase | B06B 1/0622 |
| | | | | 310/322 |

FOREIGN PATENT DOCUMENTS

| | | |
|---|---|---|
| JP | H07-22558 U | 4/1995 |
| JP | H09-36454 A | 2/1997 |
| JP | H09-36545 A | 2/1997 |
| JP | H09-289343 A | 11/1997 |
| JP | H11-284245 A | 10/1999 |
| JP | H11-284246 A | 10/1999 |
| JP | 2000-108346 A | 4/2000 |
| JP | 2001-189500 A | 7/2001 |
| JP | 2001-223406 A | 8/2001 |
| JP | 2003-188434 A | 7/2003 |

OTHER PUBLICATIONS

International Search Report issued for PCT/JP2013/073034, dated Nov. 26, 2013.
Written Opiniion of the International Searching Authority issued for PCT/JP2013/073034, dated Nov. 26, 2013.

* cited by examiner

FIG. 1(a)
FIG. 1(b)
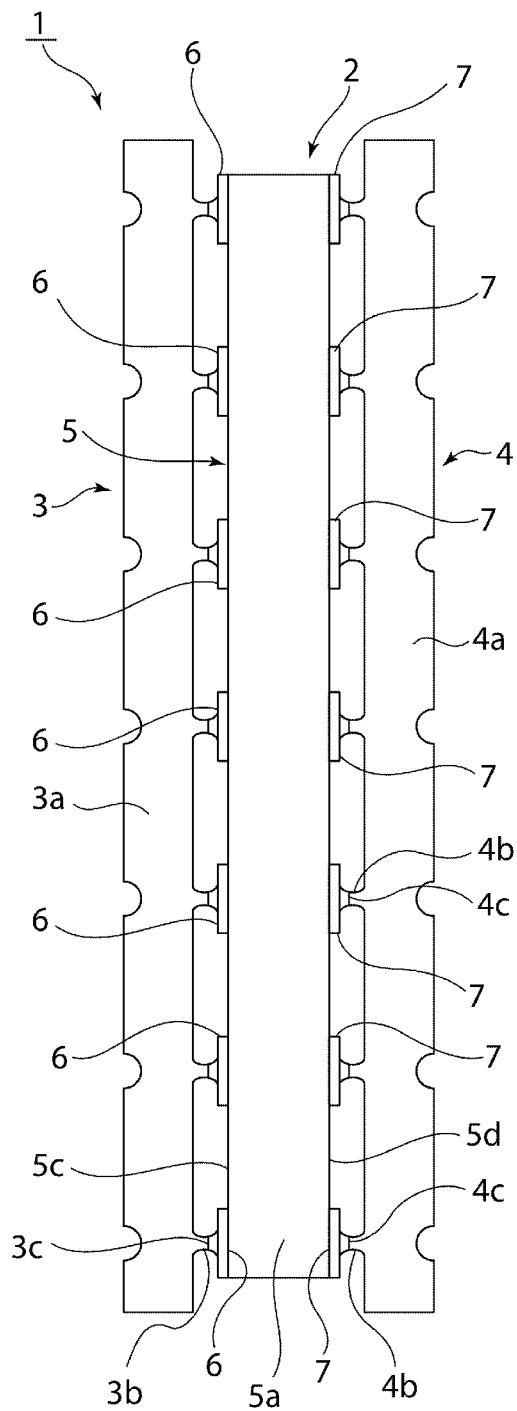
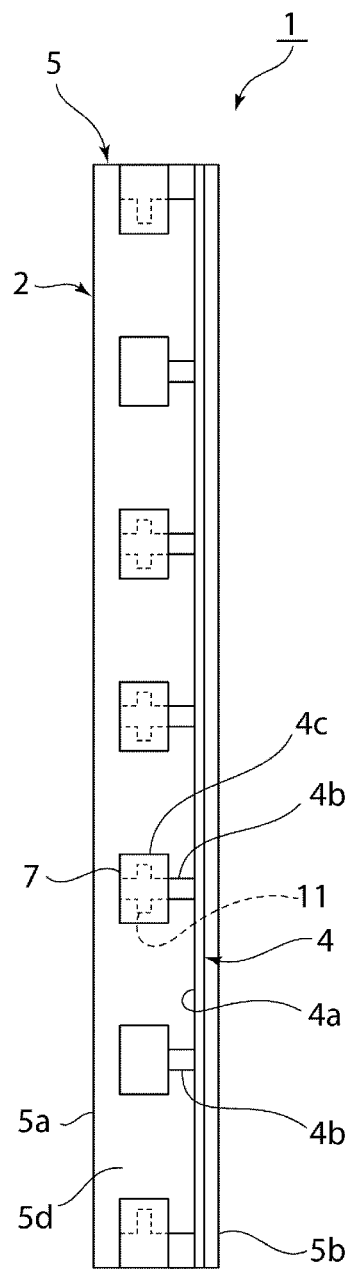

PRIOR ART

PIEZOELECTRIC TRANSFORMER DEVICE

CROSS REFERENCE TO RELATED APPLICATIONS

The present application is a continuation of PCT/JP2013/073034 filed Aug. 28, 2013, which claims priority to Japanese Patent Application No. 2012-277177, filed Dec. 19, 2012, the entire contents of each of which are incorporated herein by reference.

FIELD OF THE INVENTION

The present invention relates to a piezoelectric transformer device having a structure in which a piezoelectric transformer element is bonded to a flexible member.

BACKGROUND OF THE INVENTION

Various existing piezoelectric transformer devices using piezoelectric transformer elements made of piezoelectric ceramic have been proposed as transformer devices that are used for power supply circuits such as inverters. In a piezoelectric transformer device as disclosed in the following Patent Document 1, a piezoelectric transformer element is arranged in a mounting hole provided in a printed wiring board. In the piezoelectric transformer device as disclosed in Patent Document 1, the piezoelectric transformer element is supported by a support securing member reaching a peripheral printed wiring board portion from the upper surface of the piezoelectric transformer element arranged in the mounting hole.

On the other hand, the following Patent Document 2 discloses a piezoelectric transformer device 1001 as illustrated in an exploded perspective view in FIG. 6. A piezoelectric transformer element 1003 is mounted on an insulating member 1002 having flexibility in the piezoelectric transformer device 1001. The insulating member 1002 is a flexible printed board having a wiring pattern for electrically connecting the piezoelectric transformer element 1003 to the outside. The wiring pattern is electrically connected to a surface electrode 1003a or the like of the piezoelectric transformer element 1003.

Patent Document 1: Japanese Unexamined Patent Application Publication No. 9-36545.

Patent Document 2: Japanese Unexamined Patent Application Publication No. 11-121826.

In the piezoelectric transformer device as disclosed in Patent Document 1, the above-mentioned support securing member reaches the peripheral printed wiring board from the upper surface of the piezoelectric transformer element. Therefore, decrease in thickness of the piezoelectric transformer device is limited by the amount of thickness of the support securing member. Further, the piezoelectric transformer element and the printed wiring board are coupled by the support securing member. Due to this configuration, when temperature change occurs in the piezoelectric transformer device, mechanical stress with difference between a thermal expansion coefficient of the printed wiring board and a thermal expansion coefficient of the piezoelectric transformer element tends to be applied to coupling portions between the piezoelectric transformer element and the printed wiring board and the support securing member.

On the other hand, in the piezoelectric transformer device 1001 as disclosed in Patent Document 2, the piezoelectric transformer element 1003 is laminated and mounted on the insulating member 1002. The piezoelectric transformer device 1001 is supported by being mounted on a printed wiring board (not illustrated). Accordingly, decrease in thickness of the piezoelectric transformer device 1001 is limited by the amount of thickness of the printed wiring board. Further, in order to seal the piezoelectric transformer element 1003 from the periphery, a sealing member or a case member needs to be prepared additionally. This also makes it difficult to decrease the thickness of the piezoelectric transformer device 1001.

SUMMARY OF THE INVENTION

An object of the present invention is to provide a piezoelectric transformer device capable of being further decreased in thickness.

A piezoelectric transformer device according to an aspect of the present invention includes a piezoelectric transformer element and first and second flexible electrode members. The piezoelectric transformer element includes a piezoelectric transformer main body and first and second element electrodes. The piezoelectric transformer main body has a top surface, a bottom surface, and first and second side surfaces connecting the top surface and the bottom surface. The first side surface and the second side surface oppose each other. The first and second element electrodes are provided on the first and second side surfaces of the piezoelectric transformer main body, respectively. The first and second flexible electrode members are arranged at lateral sides of the first and second side surfaces of the piezoelectric transformer main body, respectively. The first and second flexible electrode members are electrically and mechanically connected to the first and second element electrodes, respectively.

In a specific aspect of the piezoelectric transformer device according to the present invention, the first and second flexible electrode members have first portions, second portions, and bent portions located between the first portions and the second portions. The first and second flexible electrode members are electrically and mechanically connected to the first and second element electrodes, respectively, on the second portions.

In another specific aspect of the piezoelectric transformer device according to the present invention, the bent portions of the first and second flexible electrode members are configured by multilayer bodies having first insulating films located on outermost-side portions of the bent portions, conductive layers located on intermediate portions, and second insulating films located on inner-side portions of the bent portions.

In still another specific aspect of the piezoelectric transformer device according to the present invention, when a direction orthogonal to a direction connecting the first portions and the second portions is set to a width direction, portions having widths smaller than other portions are provided on a part of the bent portions on the first and second flexible electrode members.

In still another specific aspect of the piezoelectric transformer device according to the present invention, the second portions of the first and second flexible electrode members are electrically and mechanically connected to the first and second element electrodes on the first and second side surfaces of the piezoelectric transformer main body, respectively, at upper positions than the bottom surface. Further, the first portions of the first and second flexible electrode members are formed to have flat sheet-like shapes and are arranged at height positions between the top surface and the bottom surface of the piezoelectric transformer main body.

In still another specific aspect of the piezoelectric transformer device according to the present invention, a circuit substrate on which the piezoelectric transformer element is mounted is further provided and the first portions of the first and second flexible electrode members are connected to the circuit substrate.

In still another specific aspect of the piezoelectric transformer device according to the present invention, the circuit substrate has a through-hole or a recess portion inside which the piezoelectric transformer element is arranged.

In the piezoelectric transformer device according to the present invention, the first and second flexible electrode members arranged at the lateral sides of the first and second side surfaces of the piezoelectric transformer main body of the piezoelectric transformer element are electrically and mechanically connected to the first and second element electrodes, respectively. Therefore, the piezoelectric transformer device can be decreased in thickness. Further, leakage of vibration to the external circuit substrate or the like on which the piezoelectric transformer device is mounted can be reduced.

BRIEF DESCRIPTION OF THE DRAWINGS

FIG. 1(a) and FIG. 1(b) are a plan view and a side view, respectively illustrating a piezoelectric transformer device according to an embodiment of the present invention.

DETAILED DESCRIPTION OF THE EXEMPLARY EMBODIMENTS

Hereinafter, the present invention will be made clear by describing a specific embodiment of the present invention with reference to the drawings.

FIGS. 1(a) and 1(b) are a plan view and a side view, respectively illustrating a piezoelectric transformer device according to an embodiment of the present invention.

A piezoelectric transformer device 1 according to the embodiment includes a piezoelectric transformer element 2 and first and second flexible electrode members 3 and 4.

Figure 2:
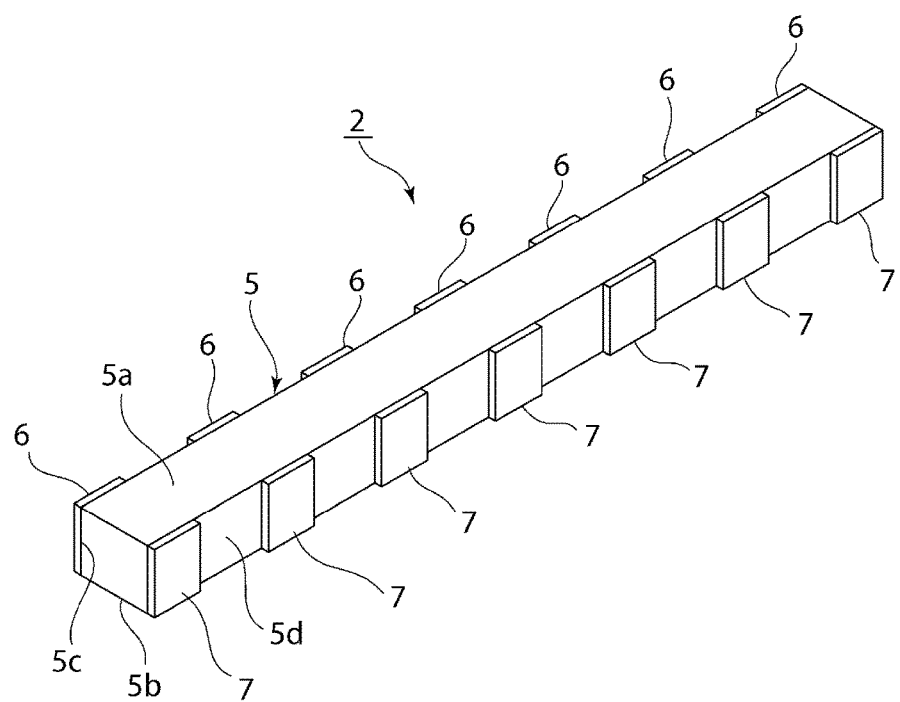
FIG. 2 is a perspective view illustrating a piezoelectric transformer element included in the piezoelectric transformer device according to the embodiment of the present invention.

FIG. 2 is a perspective view illustrating the piezoelectric transformer element 2. In the embodiment, the piezoelectric transformer element 2 employs a seventh-order vibration mode in the lengthwise direction. It should be noted that a vibration mode which is employed by the piezoelectric transformer element is not limited particularly.

The piezoelectric transformer element 2 includes a piezoelectric transformer main body 5 having an elongated rectangular parallelepiped shape, that is, a strip-like shape. The piezoelectric transformer main body 5 is made of piezoelectric ceramics. The piezoelectric transformer main body 5 has a top surface 5a, a bottom surface 5b, and first and second side surfaces 5c and 5d opposing each other.

A plurality of first and second element electrodes 6 and 7 are provided on the first and second side surfaces 5c and 5d of the piezoelectric transformer main body 5, respectively. The first and second element electrodes 6 and 7 are made of a conductive material such as an appropriate metal.

The first and second element electrodes 6 and 7 not only function as mechanical connecting portions with the first and second flexible electrode members 3 and 4 but also function as electrodes for operating the piezoelectric transformer device 1.

As illustrated in FIG. 1(a), the first flexible electrode member 3 and the second flexible electrode member 4 are arranged at the lateral sides of the first side surface 5c and the second side surface 5d of the piezoelectric transformer main body 5, respectively. The second flexible electrode member 4 is described as a representative. The second flexible electrode member 4 has a flat plate portion 4a having a flat sheet-like shape, a bent portion 4b, and a second portion 4c. The flat plate portion 4a corresponds to a first portion of a flexible electrode member in the present invention.

The bent portion 4b and the second portion 4c are continuous so as to extend toward the piezoelectric transformer element 2 from one end surface of the above-mentioned flat plate portion 4a.

In a state before the second flexible electrode member 4 is bent on the bent portion 4b, a direction toward the second portion 4c from the flat plate portion 4a as the first portion is set to a lengthwise direction and a direction orthogonal to the lengthwise direction is set to a width direction on the second flexible electrode member 4.

Figure 3:
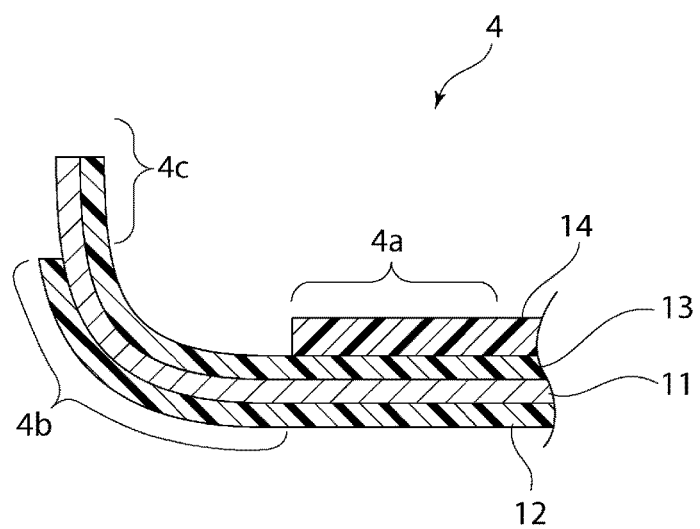
FIG. 3 is a partially cut cross-sectional view illustrating a main part of a second flexible electrode member included in the piezoelectric transformer device according to the embodiment of the present invention.

FIG. 3 is a partially cut cross-sectional view illustrating a main part of the second flexible electrode member 4. The flat plate portion 4a as the first portion and the second portion 4c are continuous through the bent portion 4b. The second flexible electrode member 4 is bent upward on the bent portion 4b.

The second flexible electrode member 4 is configured by a multilayer body having a conductive layer 11, a first insulating film 12, a second insulating film 13, and a third insulating film 14. In the embodiment, the conductive layer 11 is formed by copper foil. It is needless to say that the conductive layer 11 may be formed by another metal foil or a conductive material other than the metal foil. The conductive layer 11 is provided so as to cause the second flexible electrode member 4 to function as an electrode.

The first insulating film 12 is laminated on one surface of the conductive layer 11. The first insulating film 12 is laminated on the conductive layer 11 on the flat plate portion 4a and the bent portion 4b. That is to say, the first insulating film 12 is not laminated on the conductive layer 11 on the second portion 4c. Accordingly, the conductive layer 11 is exposed on the second portion 4c. The above-mentioned first insulating film 12 is formed by an appropriate synthetic resin film such as a polyimide film.

The conductive layer 11 is bonded to the second element electrodes 7 of the piezoelectric transformer element 2 as illustrated in FIG. 1 on the second portion 4c. The conductive layer 11 is bonded to the second element electrodes 7 with an insulating adhesive such as an epoxy based adhesive in a state of making contact with the second element electrodes 7 by pressure. With this, the second flexible electrode member 4 is mechanically and electrically connected to the second element electrodes 7. It should be noted that the conductive layer 11 may be bonded to the second element electrodes 7 with a conductive adhesive on the second portion 4c.

On the other hand, the second insulating film 13 is laminated on the surface of the conductive layer 11, which opposes the surface thereof on which the first insulating film 12 is laminated. The second insulating film 13 functions as a base member for lining the conductive layer 11. The second insulating film 13 is formed by an appropriate synthetic resin film such as a polyimide film. Further, in the embodiment, the third insulating film 14 is laminated on the surface of the second insulating film 13, which opposes the surface thereof on which the conductive layer 11 is laminated. The third insulating film 14 is also formed by an appropriate synthetic resin film such as a polyimide film.

The second flexible electrode member 4 has a structure in which the conductive layer 11 and the first to third insulating films 12 to 14 are laminated as described above, and has flexibility. Therefore, the second flexible electrode member 4 can absorb vibration from the piezoelectric transformer element 2. That is to say, leakage of vibration generated on the piezoelectric transformer element 2 to the outside can be suppressed.

The third insulating film 14 is laminated on the second insulating film 13 only on the above-mentioned flat plate portion 4a. The above-mentioned first insulating film 12 and the third insulating film 14 function as coverlays. To be more specific, the first insulating film 12 and the third insulating film 14 protects the conductive layer 11 and the base member formed by the second insulating film 13 on the flat plate portion 4a.

In order to enhance flexibility on the bent portion 4b, the third insulating film 14 is not laminated on the second insulating film 13 on the bent portion 4b. Accordingly, on the bent portion 4b, the first insulating film 12 is laminated on one surface of the conductive layer 11 and the second insulating film 13 is laminated on the surface thereof, which opposes the surface on which the first insulating film 12 is laminated. Further, on the bent portion 4b, the first insulating film 12 is located on the outermost-side portion of the bent portion. Therefore, disconnection on the conductive layer 11 can be suppressed effectively.

If the first insulating film 12 is not located on the bent portion 4b, a neutral plane of bending on the bent portion is located on the second insulating film 13. Accordingly, the conductive layer 11 is located on the outermost-side portion of the bent portion and large tensile stress by bending is applied to the conductive layer 11. This arises a risk that disconnection of the conductive layer 11 is generated with the tensile stress.

On the contrary, in the embodiment, the first insulating film 12 is located on the outermost-side portion of the bent portion 4b. Accordingly, the neutral plane of bending on the bent portion is located in the conductive layer 11. Therefore, large tensile stress is scarcely applied to the conductive layer 11 on the bent portion 4b. This can suppress disconnection of the conductive layer 11 effectively.

In the present invention, the conductive layer 11 may be located on the outermost-side portion of the bent portion 4b and the first insulating film 12 may be omitted on the above-mentioned bent portion 4b. Also in this case, the thickness can be also decreased according to the present invention. Preferably, on the bent portion 4b, the first insulating film 12 is desirably located on the outermost-side portion of the bent portion as in the embodiment. Further, the third insulating film 14 as the coverlay may be also omitted. Preferably, the third insulating film 14 is desirably provided as described above.

Figure 4:
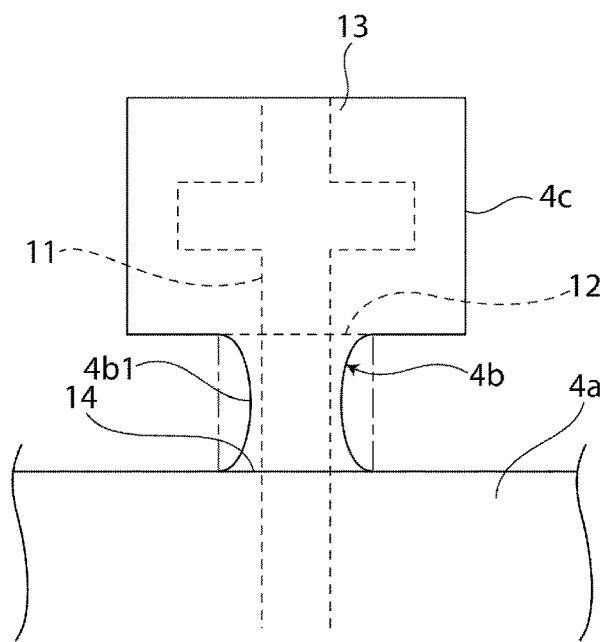
FIG. 4 is a schematic plan view illustrating a main part of the second flexible electrode member before being bent, which is included in the piezoelectric transformer device according to the embodiment of the present invention.

FIG. 4 is a schematic plan view illustrating a main part of the second flexible electrode member 4 before being bent. The bent portion 4b is located between the flat plate portion 4a and the second portion 4c. The above-mentioned conductive layer 11 reaches the second portion 4c through the bent portion 4b from the flat plate portion 4a as indicated by dashed lines.

Further, the conductive layer 11 has a cross shape when seen from the above on the second portion 4c. Therefore, the conductive layer 11 is mechanically and electrically connected to the second element electrodes 7 with sufficient areas. It should be noted that shapes of portions of the conductive layer 11, which are bonded to the second element electrodes 7, are not limited thereto.

The outer side end of the first insulating film 12 is located on the outer side end of the above-mentioned bent portion 4b.

Preferably, as illustrated in FIG. 4, the bent portion 4b desirably has a portion 4b1 having a width smaller than other portions on the bent portion 4b. In the embodiment, as illustrated in FIG. 4, the width of the bent portion 4b is the smallest at the center. The portion 4b1 having the width smaller than other portions is provided on the bent portion 4b, so that it is easy to be bent on the portion 4b1 having the small width. Accordingly, generation of variation of the bent position on the bent portion 4b can be prevented.

The second flexible electrode member 4 has been described thus far, the first flexible electrode member 3 is configured in the same manner. The first flexible electrode member 3 has a flat plate portion 3a having a flat sheet-like shape, a bent portion 3b, and a second portion 3c.

In the piezoelectric transformer device 1 in the embodiment, the piezoelectric transformer element 2 is electrically connected to and mechanically supported by the first and second flexible electrode members 3 and 4. The first and second flexible electrode members 3 and 4 have flexibility as described above. That is to say, the first and second flexible electrode members 3 and 4 are easily bent on the bent portions 3b and 4b. Accordingly, the piezoelectric transformer device 1 can be decreased in thickness by bending them on the bent portions 3b and 4b.

For example, the flat plate portions 3a and 4a can be arranged at height positions between the top surface 5a and the bottom surface 5b of the piezoelectric transformer main body 5, that is, at the upper sides relative to the bottom surface 5b. In this case, increase in thickness due to a support structure can be further suppressed. An example of the structure is illustrated in FIG. 5.

Figure 5:
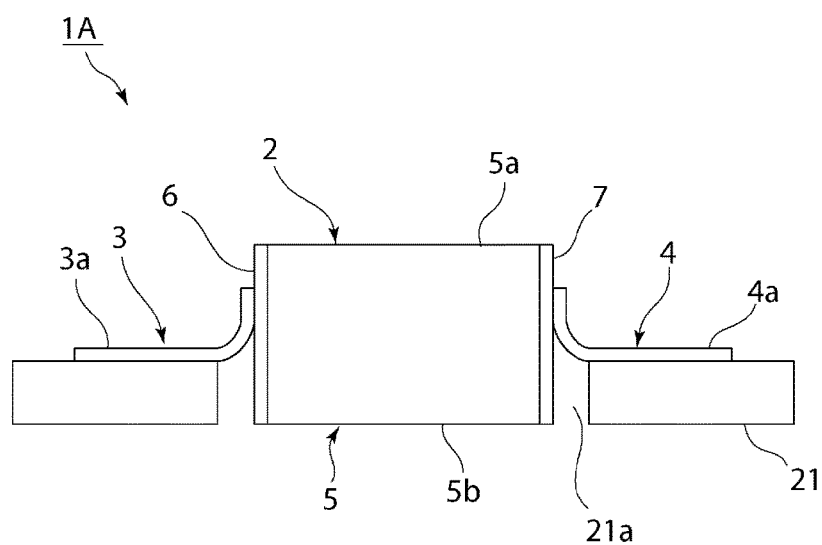
FIG. 5 is a front view illustrating a piezoelectric transformer device according to another embodiment of the present invention.
Figure 6:
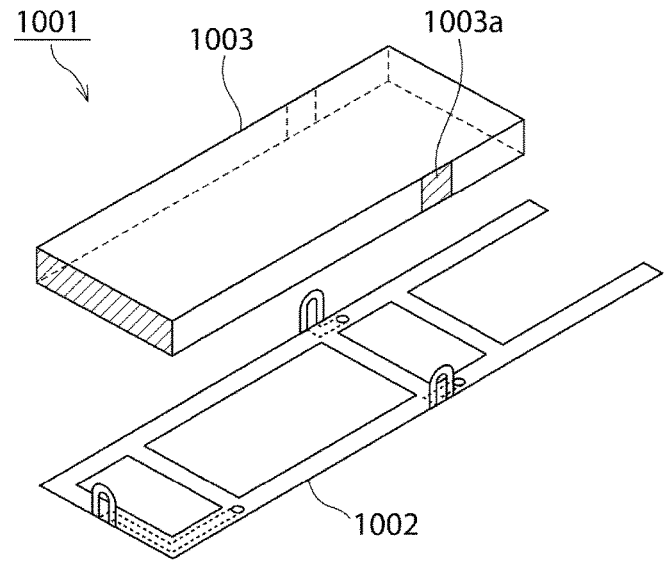
FIG. 6 is an exploded perspective view illustrating an example of an existing piezoelectric transformer device.

FIG. 5 is a front view illustrating a piezoelectric transformer device 1A according to another embodiment of the present invention. The piezoelectric transformer device 1A is different from the above-mentioned piezoelectric transformer device 1 in that it further includes a circuit substrate 21 and the flat plate portions 3a and 4a are arranged at height positions between the top surface 5a and the bottom surface 5b of the piezoelectric transformer main body 5, and other configurations thereof are the same as those of the piezoelectric transformer device 1. In the embodiment, the flat plate portions 3a and 4a of the first and second flexible electrode members 3 and 4 are arranged at the height positions between the top surface 5a and the bottom surface 5b of the piezoelectric transformer main body 5. The first and second flexible electrode members 3 and 4 are connected to corresponding electrode lands provided on the upper surface of the circuit substrate 21.

The circuit substrate 21 has a through-hole 21a. The piezoelectric transformer device 1A is arranged such that a lower portion of the piezoelectric transformer element 2 comes into the through-hole 21a. The flat plate portions 3a and 4a of the first and second flexible electrode members 3 and 4 are located on the upper surface of the circuit substrate 21. Therefore, the piezoelectric transformer device 1A can be further decreased in thickness.

In the embodiment, the lower portion of the piezoelectric transformer element 2 comes into the through-hole 21a of the circuit substrate 21, thereby decreasing the piezoelectric transformer device 1A in thickness. In this case, a recess portion into which the lower portion of the piezoelectric transformer element 2 comes may be formed in the circuit substrate 21 instead of the through-hole 21a.

In the embodiment, the piezoelectric transformer element 2 is supported by the above-mentioned first and second flexible electrode members 3 and 4. Therefore, leakage of vibration generated on the piezoelectric transformer element 2 to the circuit substrate 21 side can be suppressed. This can suppress generation of unnecessary vibration that is generated on portions including the circuit substrate 21.

REFERENCE SIGNS LIST 1, 1A PIEZOELECTRIC TRANSFORMER DEVICE
2 PIEZOELECTRIC TRANSFORMER ELEMENT
3 FIRST FLEXIBLE ELECTRODE MEMBER
3a, 4a FLAT PLATE PORTION
3b, 4b BENT PORTION
3c, 4c SECOND PORTION
4 SECOND FLEXIBLE ELECTRODE MEMBER
4b1 PORTION HAVING WIDTH SMALLER THAN OTHER PORTIONS
5 PIEZOELECTRIC TRANSFORMER MAIN BODY
5a TOP SURFACE
5b BOTTOM SURFACE
5c FIRST SIDE SURFACE
5d SECOND SIDE SURFACE
6 FIRST ELEMENT ELECTRODE
7 SECOND ELEMENT ELECTRODE
11 CONDUCTIVE LAYER
12 FIRST INSULATING FILM
13 SECOND INSULATING FILM
14 THIRD INSULATING FILM
21 CIRCUIT SUBSTRATE
21a THROUGH-HOLE

The invention claimed is:

1. A piezoelectric transformer device comprising:
a main body having a top surface, a bottom surface, and first and second side surfaces that connect the top surface and the bottom surface and that oppose each other;
first and second element electrodes disposed on the first and second side surfaces of the piezoelectric transformer main body, respectively; and
first and second flexible electrode members disposed at lateral sides of the first and second side surfaces of the main body of the piezoelectric transformer device, respectively,
wherein the first and second flexible electrode members are electrically and mechanically coupled to the first and second element electrodes, respectively,
wherein the first and second flexible electrode members each include first portions, second portions coupled to the first and second element electrodes, respectively, and bent portions disposed between the first portions and the second portions,
wherein the first portions of the first and second flexible electrode members each have a thickness that is greater than a thickness of the second portions of the first and second flexible electrode members,
wherein the bent portions and the second portions of each of the first and second flexible electrode members each includes a multilayer body having a conductive layer with a first insulating film disposed on a first surface of the conductive layer and a second insulating film disposed on a second surface of the conductive layer that opposes the first surface,
wherein the second insulating film of each multilayer body does not extend an entire length of the conductive layer, such that the second surface of each conductive layer includes an exposed contact surface that directly couples the flexible electrode member to the element electrode, respectively, and
wherein a neutral plane of bending on the bent portion of each of the first and second flexible electrode members is located in the respective conductive layer.

2. The piezoelectric transformer device according to claim 1, wherein the first portions of the first and second flexible electrode members are coupled to at least one circuit substrate.

3. The piezoelectric transformer device according to claim 1, wherein when a direction orthogonal to a direction between the first and second portions of the first and second flexible electrode members is defined as a width direction, the bent portions have widths smaller than the first and second portions of the first and second flexible electrode members.

4. The piezoelectric transformer device according to claim 1, wherein the bent portions of the first and second flexible electrode members each comprise a concave shape.

5. The piezoelectric transformer device according to claim 1, wherein the exposed contact surface of each of the second portions of the first and second flexible electrode members is electrically and mechanically coupled to the first and second element electrodes on the first and second side surfaces of the piezoelectric transformer main body, respectively, at positions closer to the top surface than the bottom surface of the of the main body of the piezoelectric transformer device.

6. The piezoelectric transformer device according to claim 5, wherein the first portions of the first and second flexible electrode members each have flat sheet-like shapes extending parallel to the top and bottom surfaces of the piezoelectric transformer main body at a height between the top and bottom surfaces.

7. The piezoelectric transformer device according to claim 1, further comprising:
a circuit substrate on which the main body of the piezoelectric transformer device is mounted.

8. The piezoelectric transformer device according to claim 7, wherein the first portions of the first and second flexible electrode members are coupled to the circuit substrate.

9. The piezoelectric transformer device according to claim 7, wherein the circuit substrate has a through hole and the main body of the piezoelectric transformer device is disposed in the through hole of the circuit substrate.

10. The piezoelectric transformer device according to claim 7, wherein the circuit substrate has an internal recess portion and the main body of the piezoelectric transformer device is disposed in the internal recess portion of the circuit substrate.

11. A piezoelectric transformer device comprising:
   a main body having first and second side surfaces that oppose each other;
   a plurality of first element electrodes disposed on the first side surface of the main body;
   a plurality of second element electrodes disposed on the second side surface of the main body;
   a first flexible electrode member disposed at a lateral side of the first side surface of the main body and having a plurality of connection members electrically and mechanically coupled to the plurality of first element electrodes, respectively; and
   a second flexible electrode member disposed at a lateral side of the second side surface of the main body and having a plurality of connection members electrically and mechanically coupled to the plurality of second element electrodes, respectively
   wherein the connection members of each of the first and second flexible electrode members includes first portions, second portions coupled to the plurality of first and second element electrodes, respectively, and flexible bent portions disposed between the first portions and the second portions,
   wherein the first portions of the first and second flexible electrode members each have a thickness that is greater than a thickness of the second portions of the first and second flexible electrode members,
   wherein the bent portions and the second portions of each of the first and second flexible electrode members each includes a multilayer body having a conductive layer with a first insulating film disposed on a first surface of the conductive layer and a second insulating film disposed on a second surface of the conductive layer that opposes the first surface,
   wherein the second insulating film of each multilayer body does not extend an entire length of the conductive layer, such that the second surface of each conductive layer includes an exposed contact surface that directly couples the respective flexible electrode member to the respective element electrode, and
   wherein a neutral plane of bending on the bent portion of each of the first and second flexible electrode members is located in the respective conductive layer.

12. The piezoelectric transformer device according to claim 11, wherein each of the flexible bent portions of the first and second flexible electrode members each comprise a concave shape.

13. The piezoelectric transformer device according to claim 11, wherein the exposed contact surface of each of the plurality of connection members of the first and second flexible electrode members is electrically and mechanically coupled to the first and second element electrodes on the first and second side surfaces of the piezoelectric transformer main body, respectively, at positions closer to a top surface than a bottom surface of the of the main body of the piezoelectric transformer device.

14. The piezoelectric transformer device according to claim 11, wherein the first and second flexible electrode members each have flat sheet-like shapes extending parallel to the top and bottom surfaces of the piezoelectric transformer main body at a height between the top and bottom surfaces.

15. The piezoelectric transformer device according to claim 11, further comprising:
   a circuit substrate on which the main body of the piezoelectric transformer device is mounted,
   wherein the first and second flexible electrode members are coupled to the circuit substrate.

16. The piezoelectric transformer device according to claim 11, wherein the circuit substrate has a through hole or a recess portion and the main body of the piezoelectric transformer device is disposed in the through hole or the recess portion of the circuit substrate.

17. The piezoelectric transformer device according to claim 1, wherein the first insulating film of the multilayer body of each of the first and second flexible electrode members extends the entire length of the conductive layer, such that a portion of the first insulating film is disposed opposite the exposed contact surface of the conductive layer.

18. The piezoelectric transformer device according to claim 11, wherein the first insulating film of the multilayer body of each of the first and second flexible electrode members extends the entire length of the conductive layer, such that a portion of the first insulating film is disposed opposite the exposed contact surface of the conductive layer.

* * * * *